(12) United States Patent
Oshima et al.

(10) Patent No.: US 11,587,951 B2
(45) Date of Patent: Feb. 21, 2023

(54) SEMICONDUCTOR DEVICE

(71) Applicant: Hitachi Automotive Systems, Ltd., Hitachinaka (JP)

(72) Inventors: Takayuki Oshima, Hitachinaka (JP); Katsumi Ikegaya, Hitachinaka (JP); Masato Kita, Hitachinaka (JP); Keishi Komoriyama, Hitachinaka (JP); Kiyotaka Kanno, Hitachinaka (JP); Shinichirou Wada, Tokyo (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 66 days.

(21) Appl. No.: 16/972,130

(22) PCT Filed: Apr. 23, 2019

(86) PCT No.: PCT/JP2019/017126
§ 371 (c)(1),
(2) Date: Dec. 4, 2020

(87) PCT Pub. No.: WO2019/244470
PCT Pub. Date: Dec. 26, 2019

(65) Prior Publication Data
US 2021/0233935 A1 Jul. 29, 2021

(30) Foreign Application Priority Data

Jun. 18, 2018 (JP) .............................. JP2018-115337

(51) Int. Cl.
*H01L 27/12* (2006.01)
*B60R 16/023* (2006.01)
*H01L 27/11575* (2017.01)

(52) U.S. Cl.
CPC ...... *H01L 27/1203* (2013.01); *B60R 16/0231* (2013.01); *H01L 27/11575* (2013.01)

(58) Field of Classification Search
CPC ......... H01L 27/1203; H01L 21/823481; H01L 27/088; H01L 21/76224; H01L 27/1207; H01L 29/78
(Continued)

(56) References Cited

U.S. PATENT DOCUMENTS

2003/0151112 A1  8/2003  Yamada
2005/0189595 A1  9/2005  Okamoto
(Continued)

FOREIGN PATENT DOCUMENTS

JP   2003-243528 A   8/2003
JP   2005-243928 A   9/2005
(Continued)

OTHER PUBLICATIONS

International Search Report with English translation and Written Opinion issued in corresponding application No. PCT/JP2019/017126 dated Aug. 13, 2019.

*Primary Examiner* — Thinh T Nguyen
(74) *Attorney, Agent, or Firm* — Foley & Lardner LLP

(57) ABSTRACT

Provided are a semiconductor device having small characteristic variations with time and high reliability and an in-vehicle control device using the same, the semiconductor device including a plurality of transistor elements constituting a current mirror circuit or a differential amplifier circuit that requires high relative accuracy. A semiconductor device includes a first metal-oxide-semiconductor (MOS) transistor, a second MOS transistor paired with the first MOS transistor, and insulation separation walls which insulate and separate elements from each other, wherein relative characteristics of the first MOS transistor and the second MOS transistor are in a predetermined range, the first MOS transistor and the second MOS transistor are relatively arranged in a gate width direction or a gate length direction, and distances between gate oxide films of the first MOS
(Continued)

transistor and the second MOS transistor and the insulation separation walls facing the gate oxide films are the same as each other in a direction perpendicular to the gate width direction or the gate length direction.

8 Claims, 10 Drawing Sheets

(58) Field of Classification Search
USPC .......................................... 257/347; 438/149
See application file for complete search history.

(56) References Cited

U.S. PATENT DOCUMENTS

| | | | |
|---|---|---|---|
| 2009/0236672 A1 | 9/2009 | Harashima | |
| 2013/0168767 A1* | 7/2013 | Lin et al. ............ | H01L 29/0696 257/337 |
| 2018/0211898 A1 | 7/2018 | Oshima | |

FOREIGN PATENT DOCUMENTS

| | | |
|---|---|---|
| JP | 2009-231563 A | 10/2009 |
| JP | 2010-027842 A | 2/2010 |
| WO | WO-2017/038344 A1 | 3/2017 |

* cited by examiner

SEMICONDUCTOR DEVICE

TECHNICAL FIELD

The present invention relates to a structure of a semiconductor device, and more particularly, to a technique effectively applied to an in-vehicle electronic control device (in-vehicle control device) requiring for high reliability.

BACKGROUND ART

In vehicle fields, an in-vehicle semiconductor device is widely used for engine control (power train), an in-vehicle information system (cockpit), electric vehicle motor control (EV.HEV), or the like, and the quality of the in-vehicle semiconductor device is required to be extremely highly managed.

In an analog circuit of the in-vehicle semiconductor device, such as an application specific integrated circuit (ASIC) or a field-programmable gate array (FPGA), a current mirror circuit to obtain a stable current output or a differential amplifier circuit to amplify a minute signal is incorporated, and characteristics of a plurality of transistors constituting such a circuit are required to coincide with each other with high accuracy.

As a background art of the present technical field, for example, there is a technique as disclosed in PTL 1.

PTL 1 discloses that "in order to provide a semiconductor device capable of implementing high consistency of characteristics of each of a plurality of circuit elements requiring relative accuracy, in a case where a certain metal-oxide-semiconductor (MOS) transistor element and another MOS transistor element requiring accuracy relative to the MOS transistor element are formed in one active region, high relative accuracy can be obtained by separating a gate electrode of the MOS transistor element from an interface between the active region and the element separation region in a channel direction of the MOS transistor element by 10 µm or more".

CITATION LIST

Patent Literature

PTL 1: JP 2010-027842 A

SUMMARY OF INVENTION

Technical Problem

As described above, in a transistor element in a current mirror circuit or a differential amplifier circuit that requires high relative accuracy, even in a case where the high relative accuracy is obtained immediately after manufacturing, as the circuit is used for a long time, the accuracy varies, and a performance of the circuit varies with time.

For example, in a case where a current is stably generated in the current mirror circuit, even when a desired current value is obtained as an initial characteristic, characteristics of the transistor may vary due to thermal or mechanical stress during use, and thus relative accuracy may vary. As a result, the current value may vary.

An object of the present invention is to provide a semiconductor device having small characteristic variations with time and high reliability and an in-vehicle control device using the same, the semiconductor device including a plurality of transistor elements constituting a current mirror circuit or a differential amplifier circuit that requires high relative accuracy.

Solution to Problem

In order to solve the above problems, a semiconductor device according to the present invention includes a first metal-oxide-semiconductor (MOS) transistor, a second MOS transistor paired with the first MOS transistor, and insulation separation walls which insulate and separate elements from each other, wherein relative characteristics of the first MOS transistor and the second MOS transistor are in a predetermined range, the first MOS transistor and the second MOS transistor are relatively arranged in a gate width direction or a gate length direction, and distances between gate oxide films of the first MOS transistor and the second MOS transistor and the insulation separation walls facing the gate oxide films are the same as each other in a direction perpendicular to the gate width direction or the gate length direction.

Advantageous Effects of Invention

According to the present invention, a semiconductor device having small characteristic variations with time and high reliability and an in-vehicle control device using the same can be implemented, the semiconductor device including a plurality of transistor elements constituting a current mirror circuit or a differential amplifier circuit that requires high relative accuracy.

Objects, configurations, and effects other than those described above will become apparent from the following description of embodiments.

DESCRIPTION OF EMBODIMENTS

Figure 1:
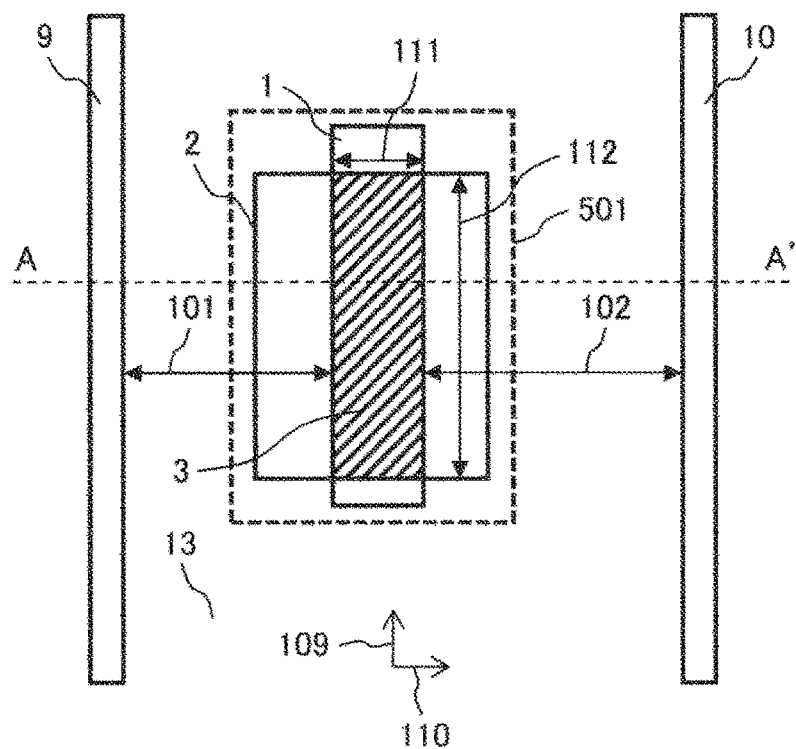
FIG. 1 is a plan view of a semiconductor device according to a first embodiment of the present invention.
Figure 1:
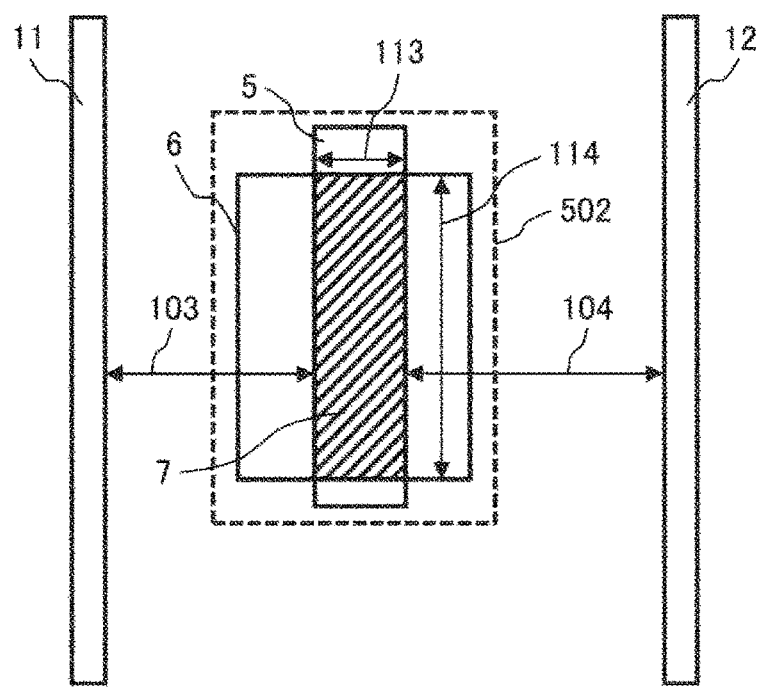

Hereinafter, embodiments of the present invention will be described using the drawings. It should be noted that in the respective drawings, the same reference numerals are given to the same components and detailed overlapped description thereof will be omitted.

First Embodiment

A semiconductor device and an in-vehicle control device according to a first embodiment of the present invention will be described with reference to FIGS. 1 to 5.

FIG. 1 illustrates a layout of a first metal-oxide-semiconductor (MOS) transistor 501 and a second MOS transistor 502 which have a relationship between a mirror source and a mirror destination that constitute a current mirror circuit. The first MOS transistor 501 and the second MOS transistor 502 are designed so that relative characteristics (transistor performances) thereof are within a predetermined range. The first and second MOS transistors 501 and 502 include gate oxide film regions 3 and 7, respectively, at portions in which active regions 2 and 6 and gate electrodes 1 and 5 are overlapped, respectively, and one of each of the active regions 2 and 6 on both sides of the gate oxide film regions 3 and 7 is a drain and the other one of each of the active regions 2 and 6 of the gate oxide film regions 3 and 7 is a source. A region on an outer side of each of the active regions 2 and 6 refers to an element separation region 13.

Insulation separation walls 9 and 10 and insulation separation walls 11 and 12 which insulate and separate elements from each other are provided around these MOS transistors 501 and 502, respectively.

The insulation separation wall 9 is a first insulation separation wall extending to face the gate oxide film region 3 of the first MOS transistor 501 in a direction perpendicular to a gate length direction 110 of the first MOS transistor 501.

The insulation separation wall 10 is a second insulation separation wall extending to face the gate oxide film region 3 of the first MOS transistor 501 in a direction perpendicular to the gate length direction 110 of the first MOS transistor 501.

The insulation separation wall 11 is a third insulation separation wall extending to face the gate oxide film region 7 of the second MOS transistor 502 in a direction perpendicular to a gate length direction 110 of the second MOS transistor 502.

The insulation separation wall 12 is a fourth insulation separation wall extending to face the gate oxide film region 7 of the second MOS transistor 502 in a direction perpendicular to the gate length direction 110 of the second MOS transistor 502.

It should be noted that although the insulation separation walls 9, 10, 11, and 12 are arranged independently of each other in FIG. 1, the insulation separation walls 9, 10, 11, and 12 may be entirely connected to each other or may be connected to each other in any combination.

In the semiconductor device of the present embodiment, as illustrated in FIG. 1, each of the first and second MOS transistors 501 and 502 is arranged in a gate width direction 109, distances 101 and 103 between one sides of the gate oxide film regions 3 and 7 and the insulation separation walls 9 and 11 in the gate length direction 110 are the same as each other, or distances 102 and 104 between the other sides of the gate oxide film regions 3 and 7 and the insulation separation walls 10 and 12 in the gate length direction 110 are the same as each other.

In a general MOS transistor, a current flowing between a drain and a source is controlled. Lengths of gate insulation films (oxide films) 3 and 7 in a direction in which a current flows are called gate lengths 111 and 113, respectively, and lengths of the gate insulation films (oxide films) 3 and 7 in a direction perpendicular thereto are called gate widths 112 and 114, respectively. That is, a gate width and a gate length which are indexes determining a performance of a MOS transistor are determined by a size of each of the active regions 2 and 6 and a width of each of the gate electrodes 1 and 5.

Figure 2:
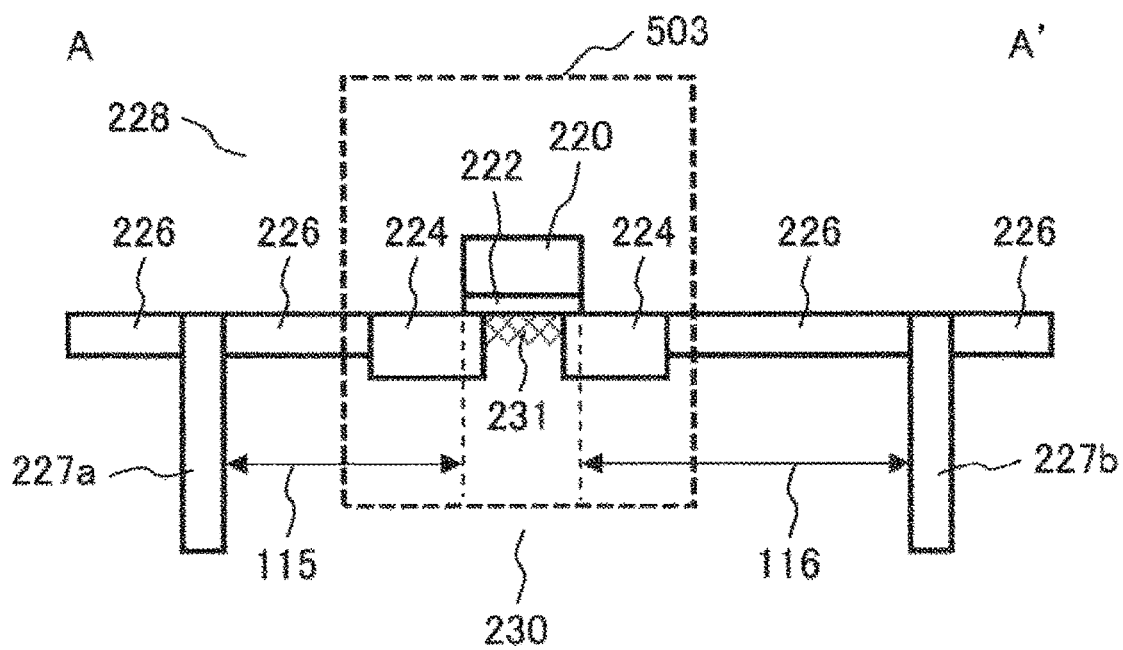
FIG. 2 is a cross-sectional view schematically illustrating a relationship between a metal-oxide-semiconductor (MOS) transistor and an insulation separation wall. (Corresponding to a cross-sectional view of A-A' of FIG. 1)

FIG. 2 schematically illustrates a cross section of the MOS transistor, and, for example, corresponds to a cross section of AA' of FIG. 1.

A MOS transistor 503 is formed on a silicon layer 230, and includes a gate oxide film 222, a gate electrode layer 220, and source or drain regions 224. A predetermined voltage is applied to the gate electrode 220 so as to control a current flowing in a conduction region (channel region) 231 of the MOS transistor. One of the MOS transistors and another transistor are separated by an element separation layer 226. Insulation separation walls 227a and 227b are mainly used to increase electrical insulating properties between elements used in a circuit or between a specific circuit region and another circuit region. An upper portion of the MOS transistor is a wiring layer region 228.

In general, a material having a high conductivity, such as polysilicon (Poly-Si) is used for a gate electrode, and a material having high insulating properties, such as a silicon oxide film ($SiO_2$) is used as the gate oxide film 222, the element separation layer 226, and the insulation separation walls 227a and 227b. In addition, aluminum (Al) or copper (Cu) is used as a main material of a wiring in the wiring layer region 228, and a material such as $SiO_2$, SiOF, SiN, or SiC is used for an insulation film between wirings.

Figure 3:
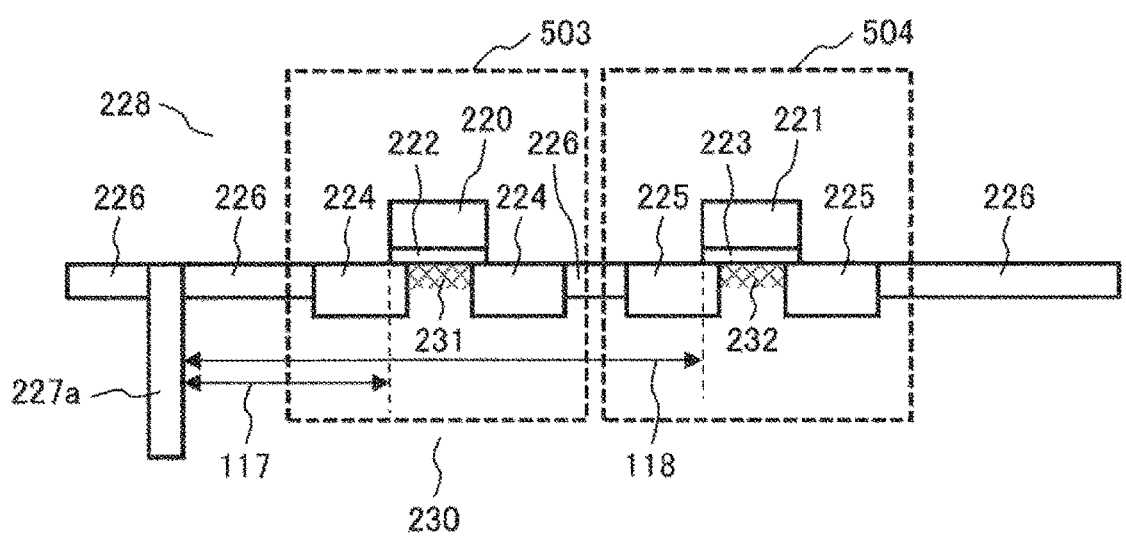
FIG. 3 is a cross-sectional view schematically illustrating a relationship between a first MOS transistor and a second MOS transistor, and an insulation separation wall.

FIG. 3 schematically illustrates a relationship between a first MOS transistor 503 and a second MOS transistor 504, and an insulation separation wall 227a. As illustrated in FIG. 3, in a case where the first MOS transistor 503 and the second MOS transistor 504 paired with the first MOS transistor 503 are arranged adjacent to each other, when mechanical stress is generated between the insulation separation wall 227a and the silicon layer 230 due to a difference in thermal expansion coefficient or the like, mobility of electrons or holes in conduction regions (channel regions) 231 and 232 of the first MOS transistor 503 and the second MOS transistor 504, or an interface level at an interface between the gate oxide films 222 and 223 and the conduction regions (channel regions) 231 and 232, is increased and decreased due to the stress, and electrical properties (a current amount, a threshold voltage, and the like) of the MOS transistor thus vary.

Since the mechanical stress varies depending on a distance from the insulation separation wall 227a, in a case where distances 117 and 118 between the gate oxide film 222 of the first MOS transistor 503 and the gate oxide film 223 of the second MOS transistor 504, from the insulation separation wall 227a are different from each other, a difference in characteristics of the first MOS transistor 503 and the second MOS transistor 504 may be generated.

Figure 4:
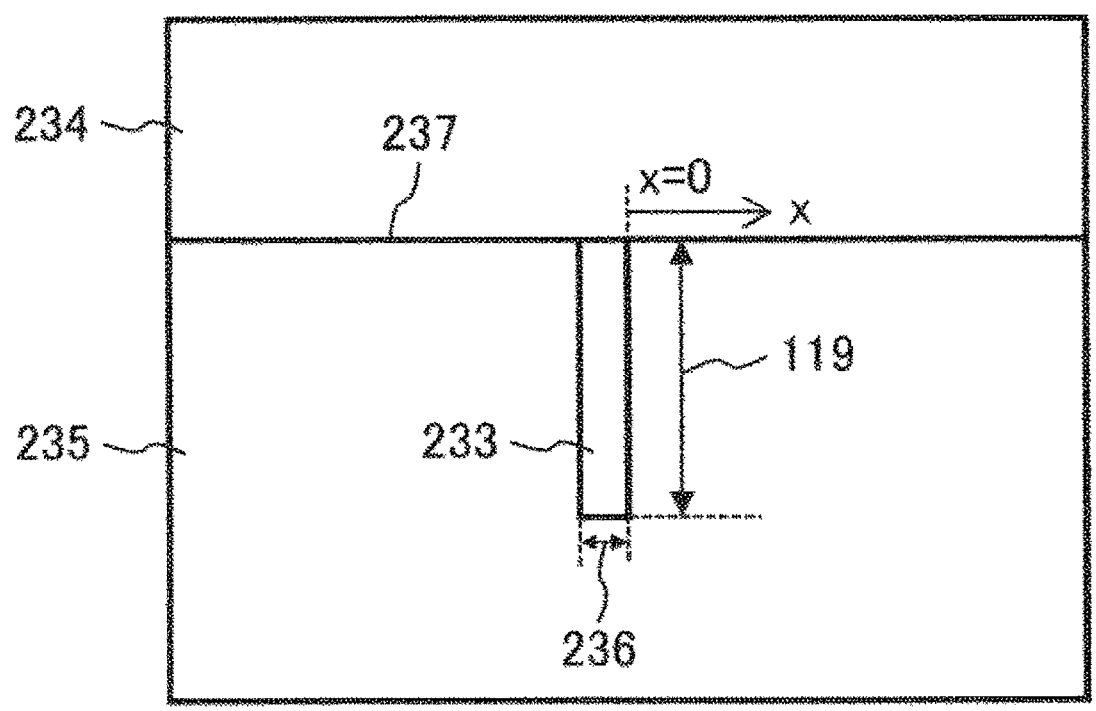
FIG. 4 is a structural view for simulating stress of an insulation separation wall.

FIG. 4 is a structural example for simulating stress of an insulation separation wall. As illustrated in FIG. 4, in a structure in which an insulation separation wall 233 filled with a silicon oxide film ($SiO_2$) is arranged in silicon (Si) 235, and an inter-layer insulation film 234 formed of a silicon oxide film ($SiO_2$) is formed on an upper portion of the insulation separation wall 233, when a temperature is changed, a strain occurs near a SiO$_2$/Si interface 237 due to a difference between linear expansion coefficients of the silicon oxide film (SiO$_2$) and the silicon (Si).

Figure 5:
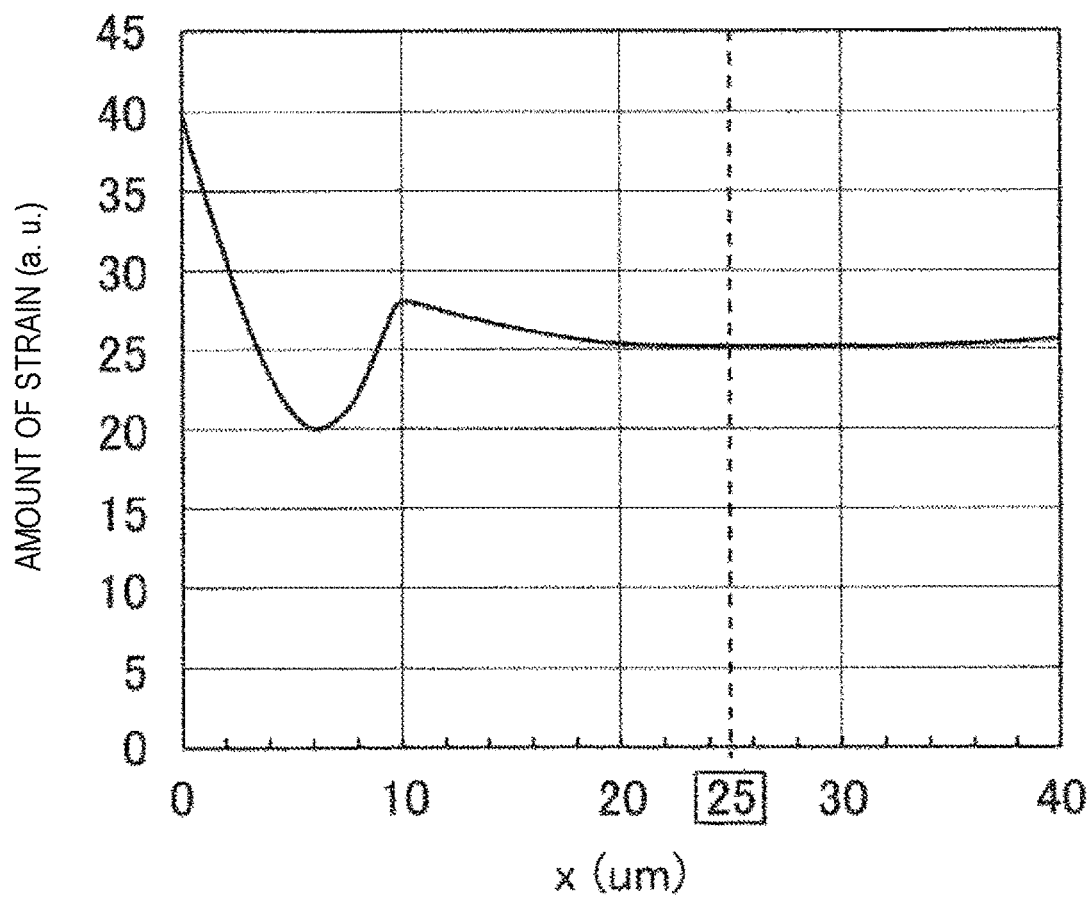
FIG. 5 is a stress dependency distribution diagram from the insulation separation wall obtained from the simulation.

When the amount of strain at the interface 237 between the silicon 235 and the inter-layer insulation film 234 is analyzed through a simulation, it can be seen that, as a distance x from the insulation separation wall 233 is decreased, the strain is increased, and the strain is transmitted even at a position separated by 20 μm or more, as illustrated in FIG. 5.

The stress is generally in proportion to the amount of strain, as it is close to the insulation separation wall 233, the stress is increased and the characteristics of the MOS transistor is highly likely to vary. In addition, the stress near the SiO$_2$/Si interface 237 may be relieved by thermal stress or the like. Even in this case, a method of varying the characteristics of the MOS transistor may vary depending on a difference in distance from the insulation separation wall 233. Therefore, as illustrated in FIG. 5, a distance between the insulation separation wall 233 and the gate oxide film of the MOS transistor arranged (formed) near the insulation separation wall 233 is set to 25 μm or more, such that an influence of the insulation separation wall 233 on the MOS transistor can be more surely suppressed.

Meanwhile, for example, in FIG. 1, the first MOS transistor 501, the second MOS transistor 502, and the insulation separation walls 9, 10, 11, and 12 are laid out so that the distances between the first MOS transistor 501 and each of the insulation separation walls 9 and 10 and the distances between the second MOS transistor 502 and each of the insulation separation walls 11 and 12 are the same as each other when at least one of the distances between the first MOS transistor 501 and each of the insulation separation walls 9 and 10 and the distances between the second MOS transistor 502 and each of the insulation separation walls 11 and 12 is 25 μm or less.

As described above, according to the present embodiment, it is possible to reduce characteristics variations with time of a plurality of transistor elements constituting the current mirror circuit or the differential amplifier circuit that requires high relative accuracy. Therefore, it is possible to improve reliability of the semiconductor device including the current mirror circuit or the differential amplifier circuit and the in-vehicle control device using the same.

Second Embodiment

A semiconductor device according to a second embodiment of the present invention will be described with reference to FIG. 6.

Figure 6:
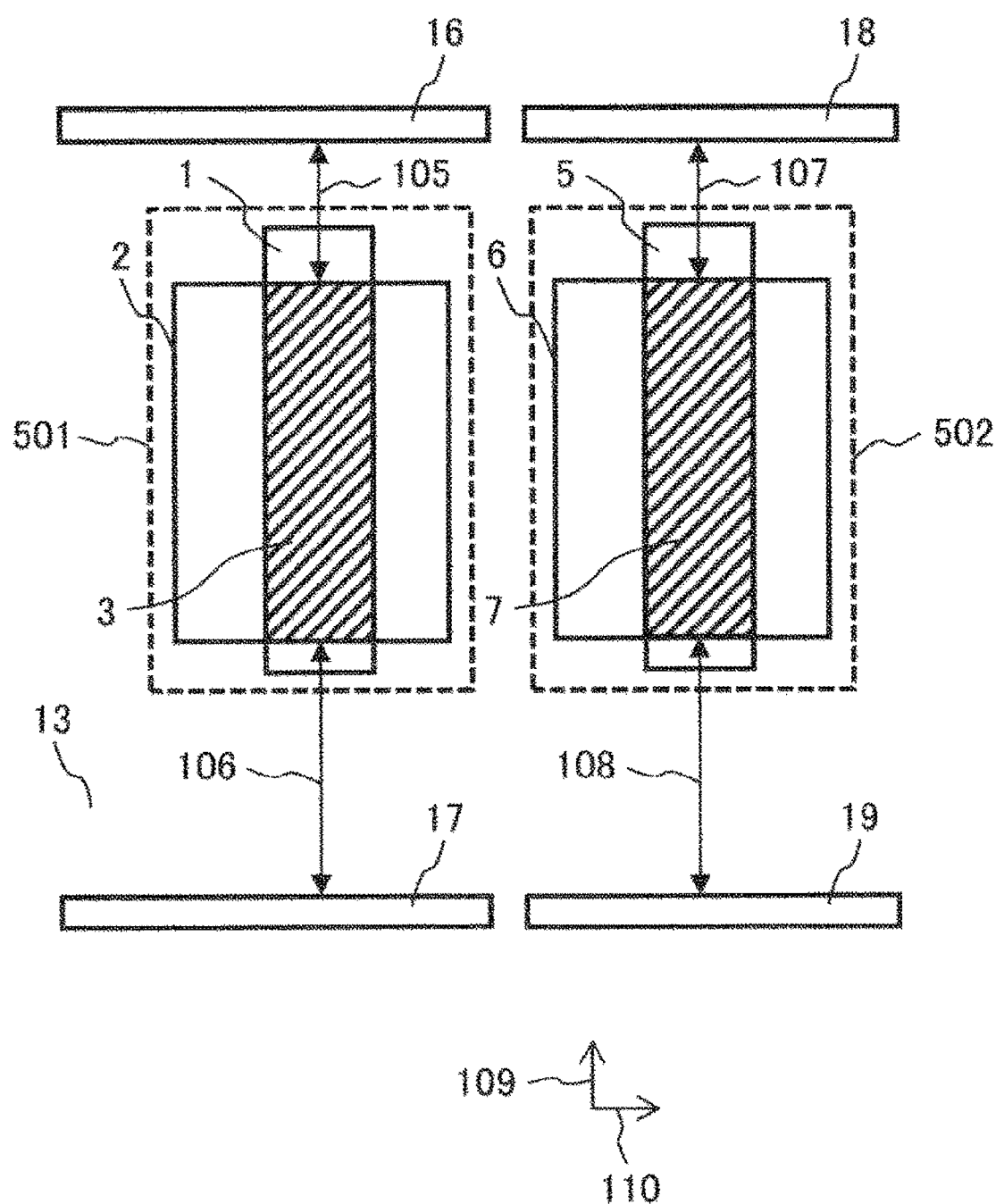
FIG. 6 is a plan view of a semiconductor device according to a second embodiment of the present invention.

FIG. 6 illustrates a layout of a first MOS transistor 501 and a second MOS transistor 502 which have a relationship between a mirror source and a mirror destination that constitute a current mirror circuit. The first and second MOS transistors 501 and 502 include gate oxide film regions 3 and 7, respectively, at portions in which active regions 2 and 6 and gate electrodes 1 and 5 are overlapped, respectively, and one of each of the active regions 2 and 6 on both sides of the gate oxide film regions 3 and 7 is a drain and the other one of each of the active regions 2 and 6 of the gate oxide film regions 3 and 7 is a source. A region on an outer side of each of the active regions 2 and 6 refers to an element separation region 13.

Insulation separation walls 16 and 17 and insulation separation walls 18 and 19 which insulate and separate elements from each other are provided around these MOS transistors 501 and 502, respectively.

The insulation separation wall 16 is a first insulation separation wall extending to face the gate oxide film region 3 of the first MOS transistor 501 in a direction perpendicular to a gate width direction 109 of the first MOS transistor 501.

The insulation separation wall 17 is a second insulation separation wall extending to face the gate oxide film region 3 of the first MOS transistor 501 in a direction perpendicular to the gate width direction 109 of the first MOS transistor 501.

The insulation separation wall 18 is a third insulation separation wall extending to face the gate oxide film region 7 of the second MOS transistor 502 in a direction perpendicular to a gate width direction 109 of the second MOS transistor 502.

The insulation separation wall 19 is a fourth insulation separation wall extending to face the gate oxide film region 7 of the second MOS transistor 502 in a direction perpendicular to the gate width direction 109 of the second MOS transistor 502.

It should be noted that although the insulation separation walls 16, 17, 18, and 19 are arranged independently of each other in FIG. 6, the insulation separation walls 16, 17, 18, and 19 may be entirely connected to each other or may be connected to each other in any combination.

In the semiconductor device of the present embodiment, as illustrated in FIG. 6, each of the first and second MOS transistors 501 and 502 is arranged in a gate length direction 110, distances 105 and 107 between one sides of the gate oxide film regions 3 and 7 and the insulation separation walls 16 and 18 in the gate width direction 109 are the same as each other, or distances 106 and 108 between the other sides of the gate oxide film regions 3 and 7 and the insulation separation walls 17 and 19 in the gate width direction 109 are the same as each other.

As illustrated in FIG. 6, even in a case where a plurality of transistor elements (here, two transistors of the first MOS transistor 501 and the second MOS transistor 502) constituting the current mirror circuit or the differential amplifier circuit are arranged in the gate length direction 110, similarly to the case where the plurality of transistor elements are arranged in the gate width direction 109 as described in the first embodiment, the distances from the gate oxide film regions of the MOS transistors to the insulation separation walls facing the gate oxide film regions are the same as each other, such that characteristics variations with time of the plurality of transistor elements can be reduced.

Third Embodiment

A semiconductor device according to a third embodiment of the present invention will be described with reference to FIG. 7.

Figure 7:
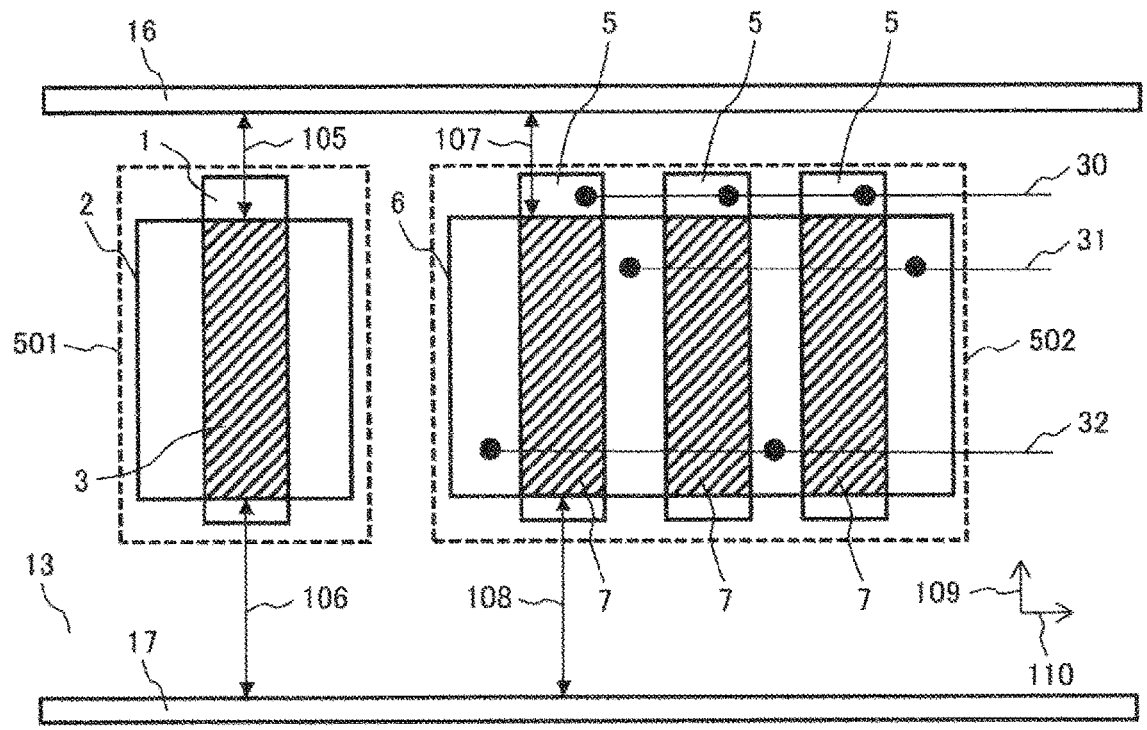
FIG. 7 is a plan view of a semiconductor device according to a third embodiment of the present invention.

FIG. 7 illustrates an embodiment in which a current larger than that of a first MOS transistor 501 is output from a second MOS transistor 502 using a current mirror circuit. The second MOS transistor 502 is composed of a transistor group in which a plurality of MOS transistors are connected to each other in parallel.

As illustrated in FIG. 7, the second MOS transistor 502 includes a set of a gate terminal 30, a drain terminal 31, and a source terminal 32 to which gates, drains, and sources of the plurality of transistors (here, three transistors) formed in the same active region 6 are connected in parallel, and the second MOS transistor 502 functions as one MOS transistor. Distances 105 and 107 between one side of a gate oxide film region 3 of the first MOS transistor 501 and an insulation separation wall 16 in a gate width direction 109 and one sides of a plurality of gate oxide film regions 7 of the second MOS transistor 502 and the insulation separation wall 16 in the gate width direction 109 are the same as each other, or distances 106 and 108 between the other side of the gate oxide film region 3 of the first MOS transistor 501 and an insulation separation wall 17 in the gate width direction 109 and the other sides of the plurality of gate oxide film regions 7 of the second MOS transistor 502 and the insulation separation wall 17 in the gate width direction 109 are the same as each other.

Even in the present embodiment, similarly to the second embodiment, characteristics variations with time of the plurality of transistor elements can be reduced. In addition, the plurality of transistors constitute the second MOS transistor 502, such that a current larger than that of the first MOS transistor 501 can be output from the second MOS transistor 502.

Fourth Embodiment

A semiconductor device according to a fourth embodiment of the present invention will be described with reference to FIG. 8.

Figure 8:
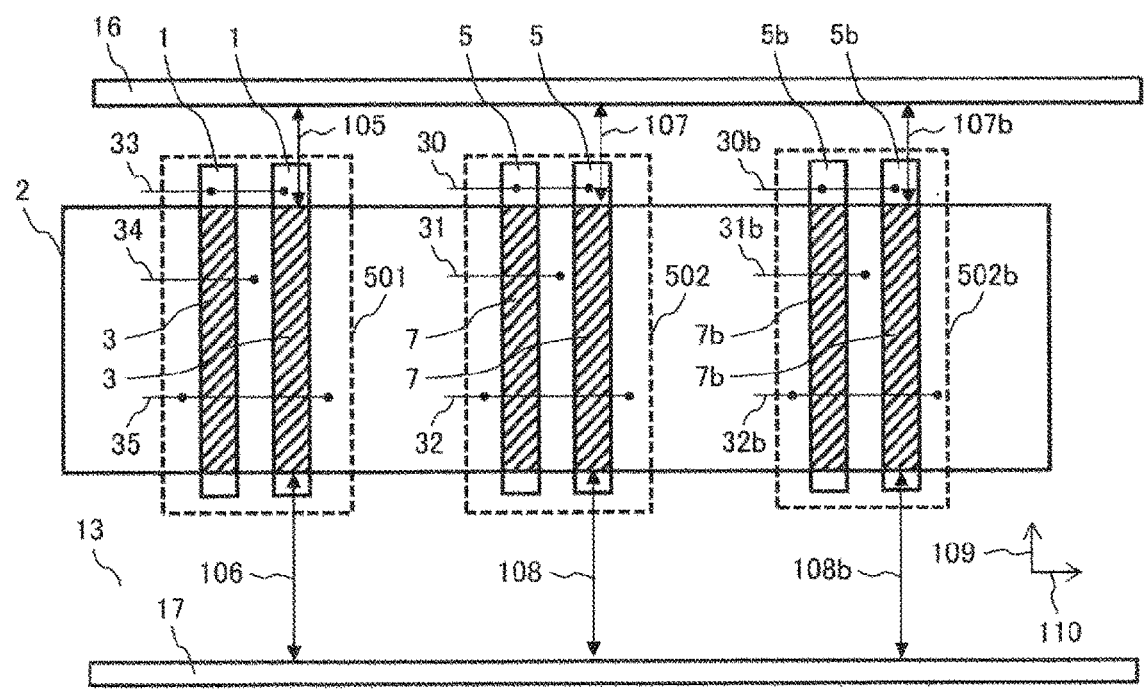
FIG. 8 is a plan view of a semiconductor device according to a fourth embodiment of the present invention.

FIG. 8 illustrates an embodiment in which the same amount of current as that of a first MOS transistor 501 is output from each of a second MOS transistor 502 and a third MOS transistor 502b using a current mirror circuit. Each of the first MOS transistor 501, the second MOS transistor 502, and the third MOS transistor 502b is composed of a transistor group in which a plurality of MOS transistors are connected to each other in parallel.

As illustrated in FIG. 8, the first MOS transistor 501, the second MOS transistor 502, and the third MOS transistor 503 are formed in the same active region 2, and include sets of gate terminals 33, 30, and 30b, drain terminals 34, 31, and 31b, and source terminals 35, 32, and 32b, respectively, the set including a gate, a drain, and a source of each of a plurality of transistors (here, each of two transistors) that are connected to each other in parallel. The first MOS transistor 501, the second MOS transistor 502, and the third MOS transistor 502b function as one MOS transistor.

As illustrated in FIG. 8, distances 105, 107, and 107b between one sides of a plurality of gate oxide films 3 included in the first MOS transistor 501, a plurality of gate oxide films 7 included in the second MOS transistor 502, and a plurality of gate oxide films 7b included in the third MOS transistor 502b, and an insulation separation wall 16 in a gate width direction 109 are the same as each other, or distances 106, 108, and 108b between the other sides of the plurality of gate oxide films 3 included in the first MOS transistor 501, the plurality of gate oxide films 7 included in the second MOS transistor 502, and the plurality of gate oxide films 7b included in the third MOS transistor 502b, and the insulation separation wall 17 in the gate width direction 109 are the same as each other.

Even in the present embodiment, similarly to the third embodiment, characteristics variations with time of the plurality of transistor elements can be reduced. In addition, each of the first MOS transistor 501, the second MOS transistor 502, and the third MOS transistor 502b is composed of a plurality of transistors, such that a current output from each of the transistor groups can be larger than that of one MOS transistor composed of the transistor groups.

Fifth Embodiment

A semiconductor device according to a fifth embodiment of the present invention will be described with reference to FIG. 9.

Figure 9:
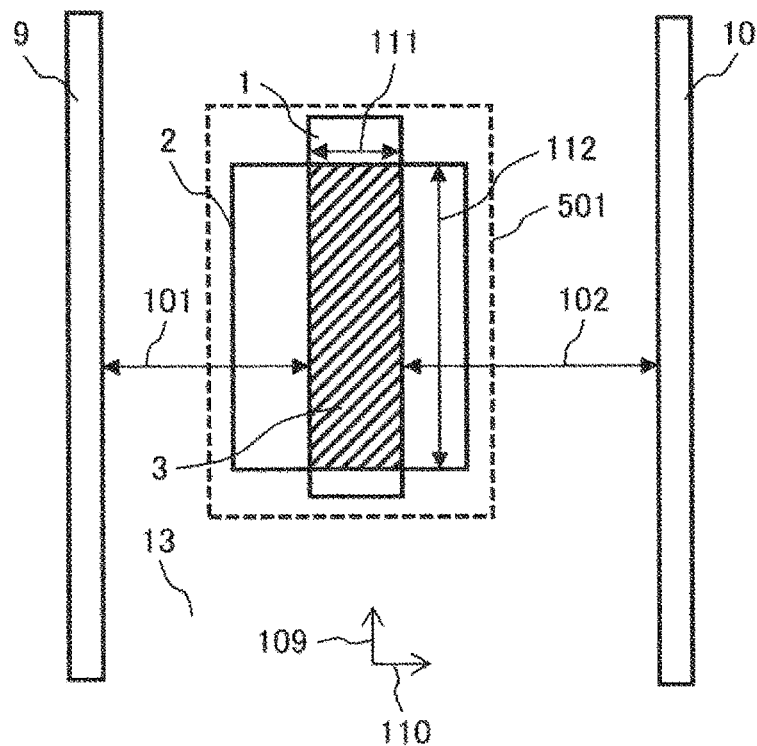
FIG. 9 is a plan view of a semiconductor device according to a fifth embodiment of the present invention.
Figure 9:
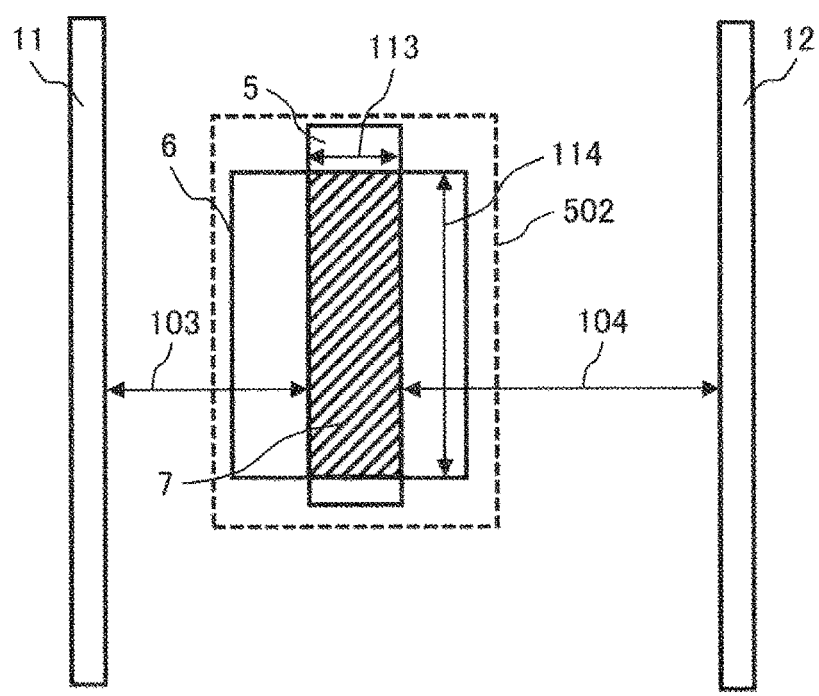

FIG. 9 illustrates a layout of a first MOS transistor 501 and a second MOS transistor 502 which have a relationship between a mirror source and a mirror destination that constitute a current mirror circuit, and is a modification of the first embodiment (FIG. 1).

The first and second MOS transistors 501 and 502 are composed of active regions 2 and 6 and gate electrodes 1 and 5, respectively, and insulation separation walls 9 and 10 and insulation separation walls 11 and 12 which insulate and separate elements from each other are provided around these MOS transistors, respectively.

The first and second MOS transistors 501 and 502 are arranged in a gate width direction 109, and distances 101 and 103 between one sides of gate oxide films 3 and 7 and insulation separation walls 9 and 11 in a gate length direction 110 perpendicular to the gate width direction 109 are 25 μm or less and have the same length.

There is no problem even in a case where any one of distances 102 and 104 between the other sides of the gate oxide films 3 and 7 and insulation separation walls 10 and 12 is more than 25 μm and the insulation separation walls 10 and 12 are arranged in different lengths.

The method is effective to sufficiently reduce an influence of stress on characteristics of the MOS transistor from the insulation separation wall when the distance from the insulation separation wall is 25 μm or more, as illustrated in FIG. 5.

Sixth Embodiment

A semiconductor device according to a sixth embodiment of the present invention will be described with reference to FIG. 10.

Figure 10:
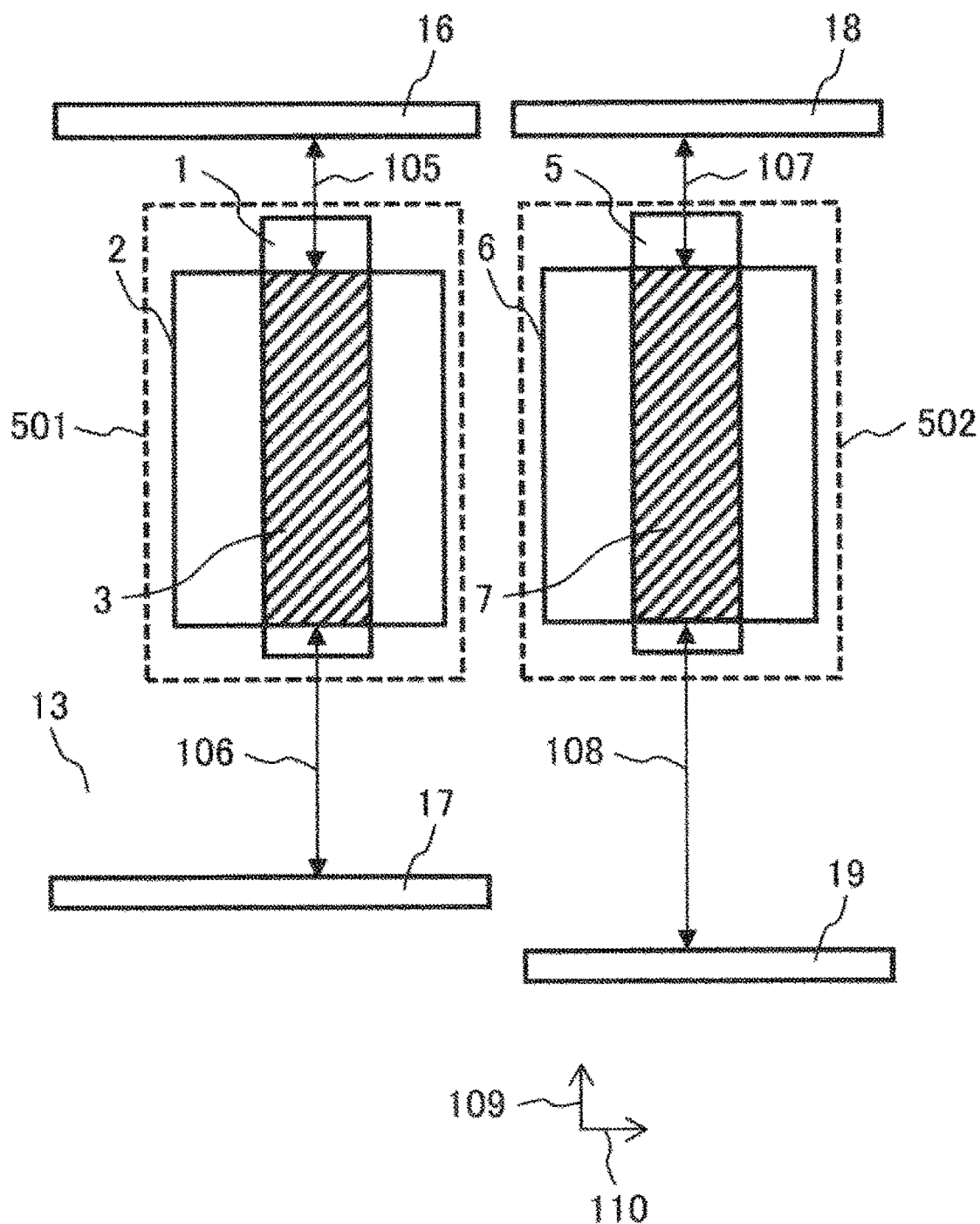
FIG. 10 is a plan view of a semiconductor device according to a sixth embodiment of the present invention.

FIG. 10 illustrates a layout of a first MOS transistor 501 and a second MOS transistor 502 which have a relationship between a mirror source and a mirror destination that constitute a current mirror circuit, and is a modification of the second embodiment (FIG. 6).

The first and second MOS transistors 501 and 502 are composed of active regions 2 and 6 and gate electrodes 1 and 5, respectively, and insulation separation walls 16 and 17 and insulation separation walls 18 and 19 which insulate and separate elements from each other are provided around these MOS transistors, respectively.

The first and second MOS transistors 501 and 502 are arranged in a gate length direction 110, and distances 105 and 107 between one sides of gate oxide films 3 and 7 and insulation separation walls 16 and 18 in a gate width direction 109 perpendicular to the gate length direction 110 are 25 μm or less and have the same length.

There is no problem even in a case where any one of distances 106 and 108 between the other sides of the gate oxide films 3 and 7 and insulation separation walls 17 and 19 is more than 25 μm and the insulation separation walls 17 and 19 are arranged in different lengths.

The method is effective to sufficiently reduce an influence of stress on characteristics of the MOS transistor from the insulation separation wall when the distance from the insulation separation wall is 25 μm or more, as illustrated in FIG. 5.

Seventh Embodiment

A semiconductor device according to a seventh embodiment of the present invention will be described with reference to FIG. 11.

Figure 11:
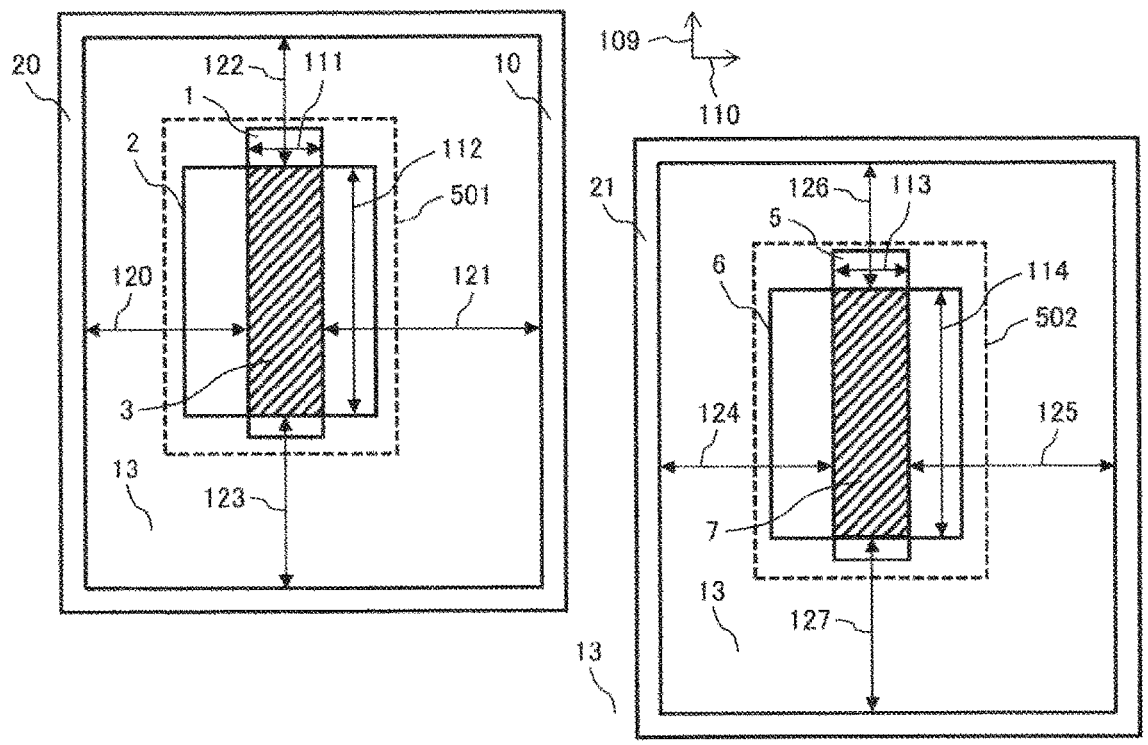
FIG. 11 is a plan view of a semiconductor device according to a seventh embodiment of the present invention.

FIG. 11 illustrates another layout of a first MOS transistor 501 and a second MOS transistor 502 which have a relationship between a mirror source and a mirror destination that constitute a current mirror circuit.

The first and second MOS transistors 501 and 502 are composed of active regions 2 and 6 and gate electrodes 1 and 5, respectively, and are surrounded by insulation separation walls 20 and 21, respectively.

Distances 120, 121, 122, and 123 between the insulation separation wall 20 surrounding the first MOS transistor 501 and four sides of a gate oxide film region 3 of the first MOS transistor 501, and distances 124, 125, 126, and 127 between the insulation separation wall 21 surrounding the second MOS transistor 502 and four sides of a gate oxide film region 7 of the second MOS transistor 502 are the same as each other, respectively.

According to the present embodiment, it is possible to reduce characteristic variations with time between the first MOS transistor 501 and the second MOS transistor 502 surrounded by the insulation separation walls 20 and 21, respectively.

Eighth Embodiment

A semiconductor device according to an eighth embodiment of the present invention will be described with reference to FIG. 12.

Figure 12:
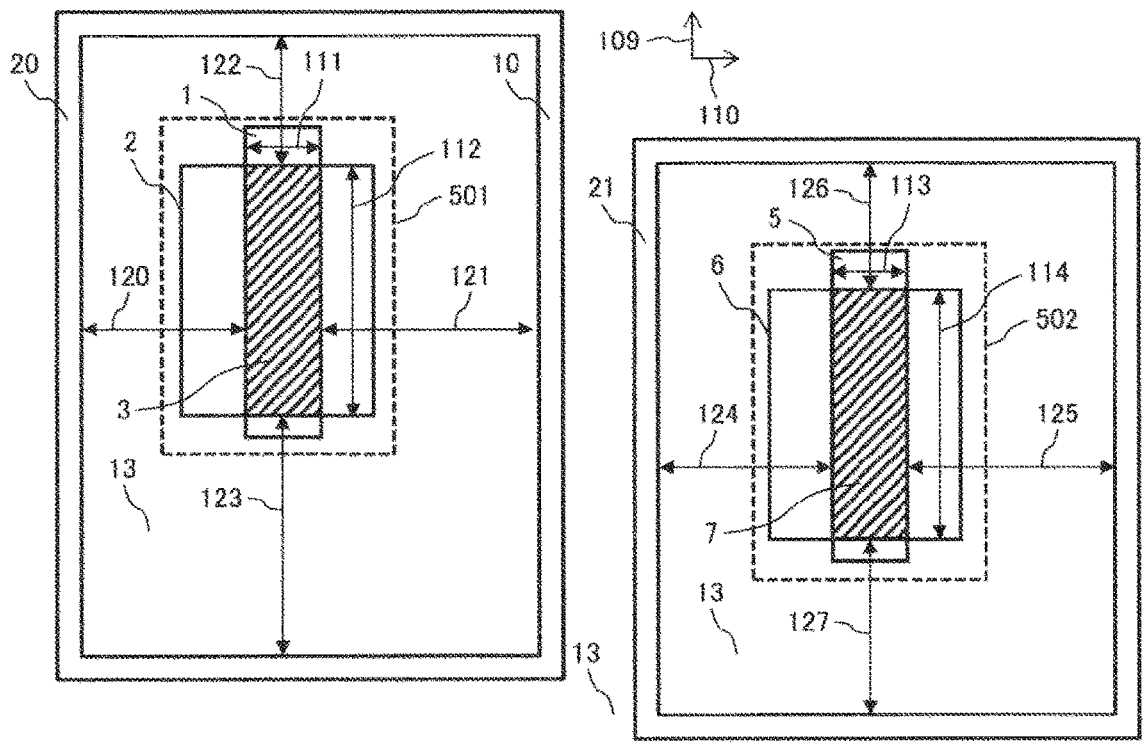
FIG. 12 is a plan view of a semiconductor device according to an eighth embodiment of the present invention.

FIG. 12 illustrates a layout of a first MOS transistor 501 and a second MOS transistor 502 which have a relationship between a mirror source and a mirror destination that constitute a current mirror circuit, and is a modification of the seventh embodiment (FIG. 11).

Similarly to the seventh embodiment (FIG. 11), the first and second MOS transistors 501 and 502 of the present embodiment include active regions 2 and 6 and gate electrodes 1 and 5, respectively, and are surrounded by insulation separation walls 20 and 21, respectively.

Meanwhile, in the present embodiment, distances 120, 121, 122, and 123 between the insulation separation wall 20 and four sides of a gate oxide film region 3 of the first MOS transistor 501, and distances 124, 125, 126, and 127 between the insulation separation wall 21 and four sides of a gate oxide film region 7 of the second MOS transistor 502 are the same as each other, respectively, when each of the distances is 25 µm or less.

The method is effective to sufficiently reduce an influence of stress on characteristics of the MOS transistor from the insulation separation wall when the distance from the insulation separation wall is 25 µm or more, as illustrated in FIG. 5.

Ninth Embodiment

A semiconductor device according to a ninth embodiment of the present invention will be described with reference to FIG. 13.

Figure 13:
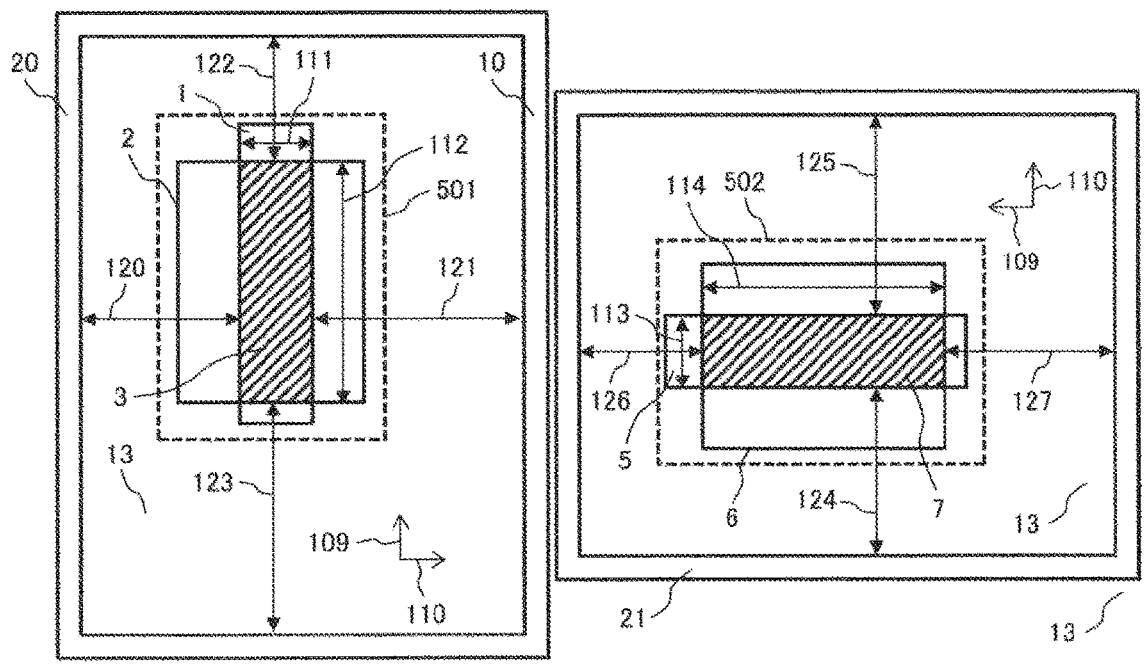
FIG. 13 is a plan view of a semiconductor device according to a ninth embodiment of the present invention.

As described in the seventh embodiment (FIG. 11) or the eighth embodiment (FIG. 12), in a case where each of the MOS transistors is surrounded by the insulation separation wall, and shapes of the MOS transistors and distances between the gate oxide films of the MOS transistors and the insulation separation walls are the same as each other, the first MOS transistor 501 and the second MOS transistor 502 can be arranged so that a gate length direction 110 of the second MOS transistor 502 is rotated by 90 degrees against a gate length direction 110 of the first MOS transistor 501, as illustrated in FIG. 13, for example.

In the present embodiment, the first MOS transistor 501 and the second MOS transistor 502 are arranged so that the gate length direction 110 of the first MOS transistor 501 and the gate length direction 110 of the second MOS transistor 502 are orthogonal to each other.

Therefore, in an analog circuit, a degree of freedom in layout design of the current mirror circuit or the differential amplification circuit is improved.

It should be noted that in each of the above-described embodiments, although a semiconductor substrate on which each of the MOS transistors and the insulation separation walls are formed has been described by assuming a semiconductor substrate (bulk wafer) formed of bulk silicon, a silicon on insulator (SOI) substrate provided with an embedded oxide film ($SiO_2$) inside the semiconductor substrate is used, such that a stray capacity or a leak current between elements can be reduced and reliability of the semiconductor device can be further improved.

In addition, the present invention is not limited to the above-described embodiments, but includes various modifications. For example, the above-described embodiments have been described in detail in order to assist in the understanding of the present invention, and the present invention is not always limited to embodiments having all the described components. In addition, it is possible to replace a part of components of an embodiment with components of another embodiment, and it is also possible to add a component of another embodiment to a component of an embodiment. In addition, regarding a part of components of each embodiment, it is possible to perform addition, deletion, or substitution using other components.

REFERENCE SIGNS LIST 1 gate electrode (region) of first MOS transistor
2 active region of first MOS transistor
3 gate oxide film region of first MOS transistor
5 gate electrode (region) of second MOS transistor
5b gate electrode region of third MOS transistor
6 active region of second MOS transistor
7 gate oxide film region of second MOS transistor
7b gate oxide film region of third MOS transistor
9 (first) insulation separation wall
10 (second) insulation separation wall
11 (third) insulation separation wall
12 (fourth) insulation separation wall
13 element separation region
16 (first) insulation separation wall
17 (second) insulation separation wall
18 (third) insulation separation wall
19 (fourth) insulation separation wall
20 insulation separation wall surrounding first MOS transistor
21 insulation separation wall surrounding second MOS transistor
30 gate terminal of second MOS transistor
31 drain terminal of second MOS transistor
32 source terminal of second MOS transistor
30b gate terminal of third MOS transistor
31b drain terminal of third MOS transistor
32b source terminal of third MOS transistor
33 gate terminal of first MOS transistor
34 drain terminal of first MOS transistor
35 source terminal of first MOS transistor
101 distance between gate oxide film region 3 of first MOS transistor and first insulation separation wall 9

102 distance between gate oxide film region 3 of first MOS transistor and second insulation separation wall 10
103 distance between gate oxide film region 7 of second MOS transistor and third insulation separation wall 11
104 distance between gate oxide film region 7 of second MOS transistor and fourth insulation separation wall 12
105 distance between gate oxide film region 3 of first MOS transistor and first insulation separation wall 16
106 distance between gate oxide film region 3 of first MOS transistor and second insulation separation wall 17
107 distance between gate oxide film region 7 of second MOS transistor and third insulation separation wall 18
107b distance between third MOS transistor and insulation separation wall
108 distance between gate oxide film region 7 of second MOS transistor and fourth insulation separation wall 19
108b distance between third MOS transistor and insulation separation wall
109 gate width direction
110 gate length direction
111 gate length of first MOS transistor
112 gate width of first MOS transistor
113 gate length of second MOS transistor
114 gate width of second MOS transistor
115 distance between gate oxide film of MOS transistor and insulation separation wall 1
116 distance between gate oxide film of MOS transistor and insulation separation wall 2
117 distance between gate oxide film of first MOS transistor and insulation separation wall
118 distance between gate oxide film of second MOS transistor and insulation separation wall
119 Insulation separation wall depth
120 distance between gate oxide film region of first MOS transistor and insulation separation wall surrounding first MOS transistor
1121 distance between gate oxide film region of first MOS transistor and insulation separation wall surrounding first MOS transistor
2122 distance between gate oxide film region of first MOS transistor and insulation separation wall surrounding first MOS transistor
3123 distance between gate oxide film region of first MOS transistor and insulation separation wall surrounding first MOS transistor
4124 distance between gate oxide film region of second MOS transistor and insulation separation wall surrounding second MOS transistor
1125 distance between gate oxide film region of second MOS transistor and insulation separation wall surrounding second MOS transistor
2126 distance between gate oxide film region of second MOS transistor and insulation separation wall surrounding second MOS transistor
3127 distance between gate oxide film region of second MOS transistor and insulation separation wall surrounding second MOS transistor
4220 gate electrode (layer) of MOS transistor
221 gate electrode of second MOS transistor
222 gate oxide film of (first) MOS transistor
223 gate oxide film of second MOS transistor
224 source or drain region of MOS transistor
225 source or drain region of second MOS transistor
226 element separation layer
227a insulation separation wall of first MOS transistor
1227b insulation separation wall of first MOS transistor
2228 wiring layer region
230 silicon layer
231 conduction region (channel region) of (first) MOS transistor
232 conduction region (channel region) of second MOS transistor
233 insulation separation wall (SiO$_2$)
234 inter-layer insulation film (SiO2)
235 silicon (Si)
236 insulation separation wall width
237 interface between silicon (Si) and inter-layer insulation film (SiO2)
501 first MOS transistor
502 second MOS transistor
502b third MOS transistor
503 (first) MOS transistor
504 second MOS transistor

The invention claimed is:

1. A semiconductor device, comprising:
a first metal-oxide-semiconductor (MOS) transistor;
a second MOS transistor paired with the first MOS transistor;
a first set of insulation separation walls that insulate and separate at least one element of the first MOS transistor from the second MOS transistor; and
a second set of insulation separation walls that insulate and separate at least one element of the second MOS transistor from the first MOS transistor,
wherein:
relative characteristics of the first MOS transistor and the second MOS transistor are in a predetermined range,
the first MOS transistor and the second MOS transistor are relatively arranged in a gate width direction or a gate length direction, and
distances between gate oxide films of the first MOS transistor and the second MOS transistor and the first set of insulation separation walls and the second set of insulation separation walls, respectively, are the same as each other in a direction perpendicular to the gate width direction and in a direction perpendicular to the gate length direction.

2. The semiconductor device of claim 1, wherein at least one of a distance between the gate oxide film of the first MOS transistor and the first set of insulation separation walls and a distance between the gate oxide film of the second MOS transistor and the second set of insulation separation walls is 25 μm or less.

3. The semiconductor device of claim 1, wherein the second MOS transistor is composed of a transistor group in which a plurality of MOS transistors are connected to each other in parallel.

4. The semiconductor device of claim 1, wherein each of the first MOS transistor and the second MOS transistor is composed of a transistor group in which a plurality of MOS transistors are connected to each other in parallel.

5. The semiconductor device of claim 1, wherein:
the first set of insulation separation walls surround the first MOS transistor; and
the second set of insulation separation walls surround the second MOS transistor.

6. The semiconductor device according to claim 5, wherein the first MOS transistor and the second MOS transistor are arranged so that a gate length direction of the first MOS transistor and a gate length direction of the second MOS transistor are orthogonal to each other.

7. The semiconductor device of claim 1, wherein the first MOS transistor, the second MOS transistor, the first set of insulation separation walls, and the second set of insulation separation walls are arranged on a silicon on insulator (SOI) substrate.

8. The semiconductor device of claim 1, wherein the semiconductor device is an in-vehicle semiconductor device mounted in an in-vehicle control device.

* * * * *